United States Patent
Qing

(10) Patent No.: US 11,950,442 B2
(45) Date of Patent: Apr. 2, 2024

(54) ARRAY SUBSTRATE AND MANUFACTURING METHOD THEREOF, DISPLAY PANEL, AND ELECTRONIC APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 141 days.

(21) Appl. No.: 17/405,249

(22) Filed: Aug. 18, 2021

(65) Prior Publication Data
US 2022/0223817 A1 Jul. 14, 2022

(30) Foreign Application Priority Data
Jan. 12, 2021 (CN) .......................... 202110036091.4

(51) Int. Cl.
*H10K 50/822* (2023.01)
*H10K 71/00* (2023.01)
*H10K 102/00* (2023.01)

(52) U.S. Cl.
CPC .......... *H10K 50/822* (2023.02); *H10K 71/00* (2023.02); *H10K 71/621* (2023.02); *H10K 2102/351* (2023.02)

(58) Field of Classification Search
None
See application file for complete search history.

(56) References Cited

U.S. PATENT DOCUMENTS

2010/0084969 A1\* 4/2010 Choi .................... H10K 71/611
313/504
2014/0091285 A1 4/2014 Shin et al.
(Continued)

FOREIGN PATENT DOCUMENTS

| CN | 108767136 A | 11/2018 |
|---|---|---|
| CN | 110148612 A | 8/2019 |
| CN | 110931653 A | 3/2020 |

OTHER PUBLICATIONS

Office Action received for Chinese Patent Application No. 202110036091.4, dated Jun. 1, 2022, 14 pages (7 pages of English Translation and 7 pages of Office Action).

*Primary Examiner* — Michelle Mandala
(74) *Attorney, Agent, or Firm* — WOMBLE BOND DICKINSON (US) LLP

(57) ABSTRACT

The present disclosure provides an array substrate and a manufacturing method thereof, a display panel, and an electronic apparatus. The array substrate includes: a base substrate; a light emitting layer on the base substrate; and a first electrode on a side of the light emitting layer away from the base substrate. The array substrate includes a light emitting area and a non-light emitting area, the first electrode is in the light emitting area and the non-light emitting area, and a thickness of a portion of the first electrode in the light emitting area is less than a thickness of a portion of the first electrode in the non-light emitting area.

17 Claims, 4 Drawing Sheets

(56) References Cited

U.S. PATENT DOCUMENTS

| | | | |
|---|---|---|---|
| 2019/0006427 A1* | 1/2019 | Lu | H10K 10/46 |
| 2020/0280016 A1* | 9/2020 | Tang | H10K 50/824 |
| 2021/0184180 A1* | 6/2021 | Zhang | H10K 71/00 |

* cited by examiner

ARRAY SUBSTRATE AND MANUFACTURING METHOD THEREOF, DISPLAY PANEL, AND ELECTRONIC APPARATUS

RELATED APPLICATIONS

This application claims the priority of the Chinese patent application No. 202110036091.4 filed on Jan. 12, 2021, and the entire disclosure of which is incorporated herein by reference.

TECHNICAL FIELD

The present disclosure relates to the field of display technology, and especially to an array substrate and a manufacturing method thereof, a display panel, and an electronic apparatus.

BACKGROUND

With the development of electronic technology, display panels are used more and more on terminal devices such as mobile devices. Commonly used terminal devices such as smart phones, tablet computers, and wearable devices are all inseparable from display panels.

The power consumption of the display panel is usually relatively high. For various terminal devices, the display panel is an important energy consumption unit. How to realize a display panel with the low power consumption has always been the research direction of the display industry.

SUMMARY

According to an aspect of the present disclosure, an array substrate is provided, comprising: a base substrate; a light emitting layer on the base substrate; and a first electrode on a side of the light emitting layer away from the base substrate. The array substrate comprises a light emitting area and a non-light emitting area, the first electrode is in the light emitting area and the non-light emitting area, and a thickness of a portion of the first electrode in the light emitting area is less than a thickness of a portion of the first electrode in the non-light emitting area.

In some embodiments, the first electrode comprises a stacked first sub-electrode layer and a second sub-electrode layer, the first sub-electrode layer is in the light emitting area and the non-light emitting area, and the second sub-electrode layer is only in the non-light emitting area.

In some embodiments, the second sub-electrode layer is on a side of the first sub-electrode layer away from the base substrate.

In some embodiments, a thickness of the second sub-electrode layer is greater than a thickness of the first sub-electrode layer.

In some embodiments, the first sub-electrode layer is in direct contact with the second sub-electrode layer.

In some embodiments, the first electrode is a single-layer conductive layer.

In some embodiments, the array substrate is an organic light emitting diode array substrate.

In some embodiments, the array substrate further comprises a second electrode between the base substrate and the light emitting layer.

In some embodiments, the first electrode is a cathode, and the second electrode is an anode.

According to another aspect of the present disclosure, a display panel comprising the array substrate described in any of the foregoing embodiments is provided.

According to still another aspect of the present disclosure, an electronic apparatus comprising the array substrate described in any of the foregoing embodiments is provided.

According to yet another aspect of the present disclosure, a method for manufacturing an array substrate is provided, wherein the array substrate comprises a light emitting area and a non-light emitting area, and the method comprises the following steps: providing a base substrate; forming a light emitting layer on the base substrate; and forming a first electrode on a side of the light emitting layer away from the base substrate, the first electrode being in the light emitting area and the non-light emitting area, and a thickness of a portion of the first electrode in the light emitting area being less than a thickness of a portion of the first electrode in the non-light emitting area.

In some embodiments, the step of forming a first electrode on a side of the light emitting layer away from the base substrate comprises: forming a first sub-electrode layer in the light emitting area and the non-light emitting area on the side of the light emitting layer away from the base substrate; and forming a second sub-electrode layer only in the non-light emitting area on a side of the first sub-electrode layer away from the base substrate.

In some embodiments, forming the first sub-electrode layer on the side of the light emitting layer away from the base substrate through an evaporation process by using an open mask; and forming the second sub-electrode layer on the side of the first sub-electrode layer away from the base substrate through an evaporation process by using a fine metal mask.

In some embodiments, a thickness of the second sub-electrode layer is greater than a thickness of the first sub-electrode layer.

In some embodiments, the first sub-electrode layer is in direct contact with the second sub-electrode layer.

In some embodiments, the step of forming a first electrode on a side of the light emitting layer away from the base substrate comprises: applying a single-layer conductive layer on the side of the light emitting layer away from the base substrate, and patterning the single-layer conductive layer to form the first electrode.

In some embodiments, the array substrate is formed as an organic light emitting diode array substrate.

In some embodiments, before forming the light emitting layer on the base substrate, the method further comprises: forming a second electrode on the base substrate, the second electrode being between the base substrate and the light emitting layer.

In some embodiments, the step of forming a second electrode on the base substrate comprises: forming an anode on the base substrate, and, the step of forming a first electrode on a side of the light emitting layer away from the base substrate comprises: forming a cathode on the side of the light emitting layer away from the base substrate.

BRIEF DESCRIPTION OF THE DRAWINGS

In order to illustrate more clearly the technical solutions in the embodiments of the present disclosure, the drawings that need to be used in the embodiments will be briefly introduced below. Obviously, the following drawings are only some embodiments of the present disclosure. For those of ordinary skill in the art, other drawings can also be obtained according to these drawings without creative work.

DETAILED DESCRIPTION OF THE DISCLOSURE

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

As mentioned above, more and more terminal devices use display panels to implement the display function, and reducing the power consumption of the display panels has always been the direction of the panel industry's efforts to improve. An organic light emitting diode (OLED) display panel usually comprises an anode, a cathode, and a light emitting layer located between the anode and the cathode. The cathode mainly affects the power consumption of the display panel in two aspects, one is the transmittance of the cathode to the light emitted by the display panel, and the other is the resistance of the cathode. In order to achieve low power consumption of the display panel, ideally, the transmittance of the cathode should be increased while the resistance of the cathode should be reduced. However, to increase the transmittance of the cathode, the film thickness of the cathode must be reduced, and reducing the film thickness of the cathode will inevitably increase the resistance of the cathode. If the resistance of the cathode is increased, since the light emitting current of all pixels of the display panel must pass through the cathode, the voltage loss on the cathode will increase significantly, which runs counter to the goal of achieving low power consumption of the display panel. Therefore, in the conventional technology, it seems impossible to simultaneously increase the transmittance of the cathode while reducing the resistance of the cathode.

Figure 1:
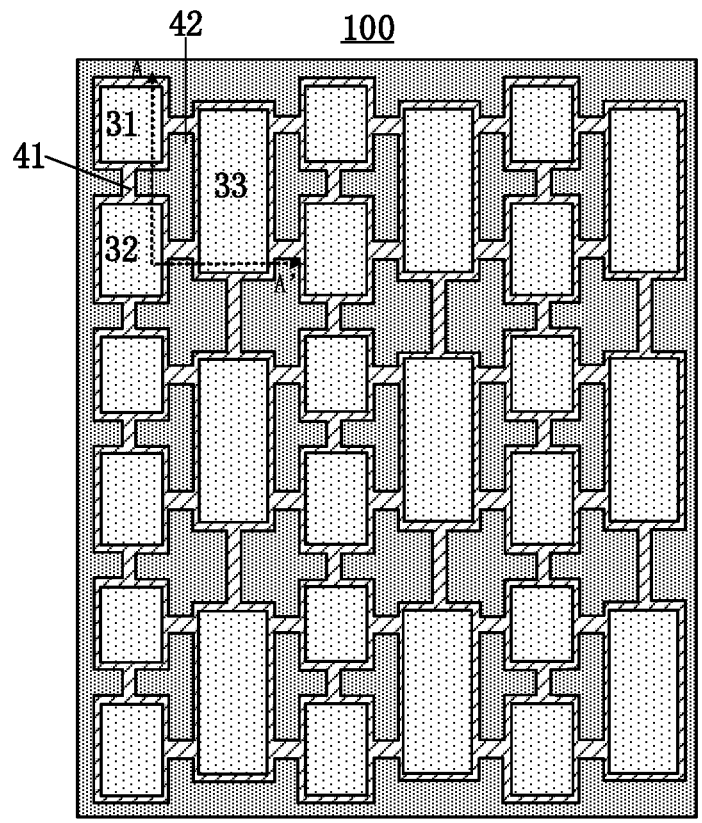
FIG. 1 illustrates a top view of an array substrate provided by an embodiment of the present disclosure.
Figure 2:
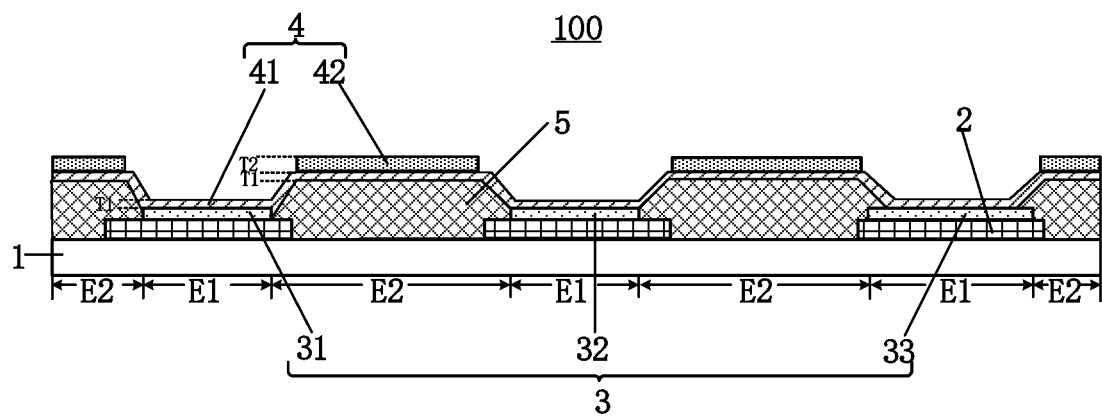
FIG. 2 illustrates a cross sectional view of the array substrate taken along the line A-A' in FIG. 1.

In view of this, an embodiment of the present disclosure provides an array substrate. FIG. 1 illustrates a top view of the array substrate 100, and FIG. 2 illustrates a cross sectional view of the array substrate 100 taken along the line A-A' in FIG. 1. Referring to FIG. 1 and FIG. 2, the array substrate 100 comprises: a base substrate 1; a light emitting layer 3 on the base substrate 1; and a first electrode 4 on a side of the light emitting layer 3 away from the base substrate 1. The array substrate 100 comprises a light emitting area E1 and a non-light emitting area E2. The first electrode 4 is located in the light emitting area E1 and the non-light emitting area E2, and a thickness of a portion of the first electrode 4 located in the light emitting area E1 is less than a thickness of a portion of the first electrode 4 located in the non-light emitting area E2. In this application, the term "a thickness of XX" refers to the thickness of XX in the direction perpendicular to the substrate 1.

It should be noted that in the present application, the term "light emitting area" refers to the area where the light emitting layer 3 is located in the array substrate 100, and "non-light emitting area" refers to other areas in the array substrate 100 except the area where the light emitting layer 3 is located, for example, the non-light emitting area may be other areas in the display area of the array substrate 100 other than the area where the light emitting layer 3 is located. Referring to FIG. 2, FIG. 2 illustrates a pixel structure of the array substrate 100, and the pixel comprises three sub pixels. The light emitting layer 3 comprises a first light emitting layer 31, a second light emitting layer 32, and a third light emitting layer 33. The first light emitting layer 31, the second light emitting layer 32, and the third light emitting layer 33 are respectively located in a respective one of the three sub pixels. The areas where the first light emitting layer 31, the second light emitting layer 32, and the third light emitting layer 33 are located are the light emitting area E1 of the array substrate 100, and the other areas other than the areas where the first light emitting layer 31, the second light emitting layer 32, and the third light emitting layer 33 are located are the non-light emitting area E2 of the array substrate 100.

In the embodiments of the present disclosure, on the one hand, by making the portion of the first electrode 4 located in the light emitting area E1 have a thinner thickness, the transmittance of the first electrode 4 to the light emitted by the light emitting layer 3 can be improved. Thereby, the light emitting brightness of the array substrate 100 can be improved, the pixel light emitting current of the array substrate 100 can be reduced, and therefore the power consumption of the array substrate 100 can be reduced. On the other hand, by making the portion of the first electrode 4 located in the non-light emitting area E2 have a thicker thickness (larger than the thickness of the portion of the first electrode 4 located in the light emitting area E1), it is possible to reduce the overall resistance of the first electrode 4 while increasing the transmittance of the portion of the first electrode 4 located in the light emitting area E1. Thus, the voltage loss across the first electrode 4 is reduced, so that the power consumption of the array substrate 100 can be further reduced.

As illustrated in FIG. 2, the array substrate 100 also comprises a second electrode 2, and the second electrode 2 is located between the base substrate 1 and the light emitting layer 3. The array substrate 100 may be an OLED array substrate or an inorganic light emitting diode array substrate. The embodiment of the present disclosure does not specifically limit the type of the array substrate 100. In one example, the array substrate 100 is an OLED array substrate. In this case, the light emitting layer 3 is an organic light emitting layer, the second electrode 2 can be an anode, and the first electrode 4 can be a cathode. That is, the cathode is employed as the light transmitting electrode of the light emitting layer 3 to ensure the display effect. Of course, it is also possible to set the second electrode 2 as a cathode and the first electrode 4 as an anode, which is not limited herein. As illustrated in FIG. 1 and FIG. 2, the first light emitting layer 31 may be a red light emitting layer 31, the second light emitting layer 32 may be a green light emitting layer, and the third light emitting layer 33 may be a blue light emitting layer. The first light emitting layer 31, the second light emitting layer 32, and the third light emitting layer 33 correspond to the red sub pixel, the green sub pixel, and the blue sub pixel, respectively. It should be noted that FIG. 1 illustrates a pixel arrangement of the array substrate 100 only as an example, but the pixels of the array substrate 100 are not limited to the pixel arrangement shown in the figure.

The array substrate 100 may also comprise a pixel definition layer (PDL) 5. The pixel definition layer 5 is disposed in the region between the light emitting areas E1 to isolate the light emitting areas E1, preventing short circuits and point discharges.

The area of the first electrode 4 covering the light emitting area E1 is a relatively thin area to increase the transmittance of the first electrode 4. The area of the first electrode 4 covering the non-light emitting area E2 is a relatively thick area to reduce the resistance of the first electrode 4. The thickness of the portion of the first electrode 4 covering the light emitting area E1 is relatively thin, so as to avoid errors in the processing process causing the first electrode 4 on the light emitting area E1 to be too thick, which affects the transmittance.

There are a variety of manners to realize that the thickness of the portion of the first electrode 4 located in the light emitting area E1 is less than the thickness of the portion of the first electrode 4 located in the non-light emitting area E2. Two implementations are described below as examples.

FIG. 2 illustrates an implementation in which the thickness of the portion of the first electrode 4 located in the light emitting area E1 is less than the thickness of the portion of the first electrode 4 located in the non-light emitting area E2. In this implementation, the first electrode 4 comprises multi-layer sub-electrode layers. As illustrated in the figure, the first electrode 4 comprises a stacked first sub-electrode layer 41 and a second sub-electrode layer 42. The first sub-electrode layer 41 is located in the light emitting area E1 and the non-light emitting area E2, and the second sub-electrode layer 42 is only located in the non-light emitting area E2. The thickness of the first sub-electrode layer 41 is T1, and the thickness of the second sub-electrode layer 42 is T2. Different thicknesses of the first electrode 4 in different areas are realized by the spatially spaced distribution of the second sub-electrode layer 42, so that the thickness of the portion of the first electrode 4 located in the light emitting area E1 is T1, and the thickness of the portion of the first electrode 4 located in the non-light emitting area E2 is T1+T2. Therefore, the thickness of the portion of the first electrode 4 located in the light emitting area E1 is less than the thickness of the portion of the first electrode 4 located in the non-light emitting area E2. The specific value of the thickness T1 of the first sub-electrode layer 41 can be set according to the transmittance and process conditions required by the array substrate 100, and the specific value of the thickness T2 of the second sub-electrode layer 42 can be set according to the resistance and process conditions required by the second electrode 4.

FIG. 2 illustrates that the second sub-electrode layer 42 is located on the side of the first sub-electrode layer 41 away from the base substrate 1, that is, the second sub-electrode layer 42 is located over the first sub-electrode layer 41, and the first sub-electrode layer 41 is in direct contact with the second sub-electrode layer 42. Of course, this is just an example. In an alternative example, the second sub-electrode layer 42 may also be located on a side of the first sub-electrode layer 41 close to the base substrate 1, that is, the second sub-electrode layer 42 is located below the first sub-electrode layer 41. The embodiment of the present disclosure does not specifically limit the relative positional relationship between the first sub-electrode layer 41 and the second sub-electrode layer 42. Disposing the second sub-electrode layer 42 over the first sub-electrode layer 41 can avoid voids or gaps due to uneven distribution of electrode materials at the edges of the second sub-electrode layer 42 when the first sub-electrode layer 41 is prepared over the second sub-electrode layer 42 with spatially spaced distribution. Thereby, it is more beneficial to prepare the first electrode 4 with high reliability.

In one example, the thickness T2 of the second sub-electrode layer 42 is greater than the thickness T1 of the first sub-electrode layer 41, to further ensure the transmittance of the first sub-electrode layer 41 to the light emitted by the light emitting layer 3, and further reduce the overall resistance of the first electrode 4. In some embodiments, the thickness T1 of the first sub-electrode layer 41 is less than the thickness of the cathode layer in the conventional array substrate, and the thickness T2 of the second sub-electrode layer 42 is greater than the thickness of the cathode layer in the conventional array substrate.

Setting the first electrode 4 as a multi-layer sub-electrode layer can more accurately thicken the portion of the first electrode 4 located in the non-light emitting area E2 without adding an extra manufacturing process to damage the light emitting layer 3, which can improve the reliability of the prepared array substrate 100.

Of course, the number of sub-electrode layers included in the first electrode 4 is not limited to two layers, and three or four sub-electrode layers can also be provided, which is not limited herein.

By making the first electrode 4 comprise a stacked first sub-electrode layer 41 and a second sub-electrode layer 42, the first sub electrode layer 41 is located in the light emitting area E1 and the non-light emitting area E2 and its thickness is T1, and the second sub-electrode layer 42 is only located in the non-light emitting area E2 and its thickness is T2, therefore, the thickness of the portion of the first electrode 4 located in the light emitting area E1 (that is, the thickness T1 of the first sub-electrode layer 41) is significantly less than the thickness of the portion of the first electrode 4 located in the non-light emitting area E2 (that is, the thickness T1 of the first sub-electrode layer 41+the thickness T2 of the second sub-electrode layer 42). This can not only increase the transmittance of the portion of the first electrode 4 located in the light emitting area E1, but also reduce the overall resistance of the first electrode 4. Thus, the power consumption of the array substrate 100 can be significantly reduced.

Figure 3:
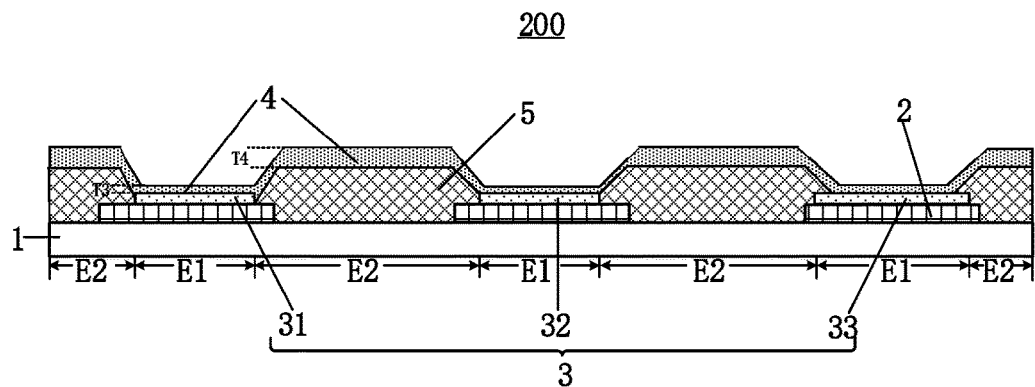
FIG. 3 illustrates a cross sectional view of an array substrate provided by another embodiment of the present disclosure.

FIG. 3 illustrates another implementation in which the thickness of the portion of the first electrode 4 located in the light emitting area E1 is less than the thickness of the portion of the first electrode 4 located in the non-light emitting area E2. The array substrate 200 illustrated in FIG. 3 has substantially the same configuration as the array substrate 100 illustrated in FIG. 2 and therefore the same reference numerals are used to refer to the same components. As illustrated in the figure, the array substrate 200 also comprises: a base substrate 1; a second electrode 2 located on the base substrate 1; a light emitting layer 3 located on a side of the second electrode 2 away from the base substrate 1; and a first electrode 4 on a side of the light emitting layer 3 away from the base substrate 1. The array substrate 200 comprises a light emitting area E1 and a non-light emitting area E2, and the first electrode 4 is located in the light emitting area E1 and the non-light emitting area E2.

The difference from the array substrate 100 is that, in the array substrate 200, the first electrode 4 is a single-layer conductive layer with uneven thickness, instead of at least two electrode layers stacked with each other. As illustrated in the figure, a thickness T3 of a portion of the first electrode 4 located in the light emitting area E1 is less than a thickness T4 of a portion of the first electrode 4 located in the non-light emitting area E2. In the preparation process, first a thicker first electrode layer can be formed in the light emitting area E1 and the non-light emitting area E2, and then the portion of the first electrode layer located in the light emitting area E1 can be thinned by grinding or etching, thereby forming the first electrode 4 with a single-layer conductive layer to achieve that the electrode thickness T3 in the light emitting area E1 is less than the electrode thickness T4 in the non-light emitting area E2.

By designing the first electrode 4 as a single-layer conductive layer with uneven thickness, the thickness T3 of the portion of the first electrode 4 located in the light emitting area E1 is less than the thickness T4 of the portion of the first electrode 4 located in the non-light emitting area E2. In this way, the transmittance of the portion of the first electrode 4 located in the light emitting area E1 not only can be increased, but also the overall resistance of the first electrode 4 can be reduced, so that the power consumption of the array substrate 200 can be significantly reduced.

The above is only used as examples to introduce the two implementations to achieve that the thickness of the portion of the first electrode 4 located in the light emitting area E1 is less than the thickness of the portion of the first electrode 4 located in the non-light emitting area E2. Of course, the technical means to achieve this objective are not limited to the above two manners, and the embodiments of the present disclosure do not specifically limit the technical means to achieve this objective.

Figure 4:
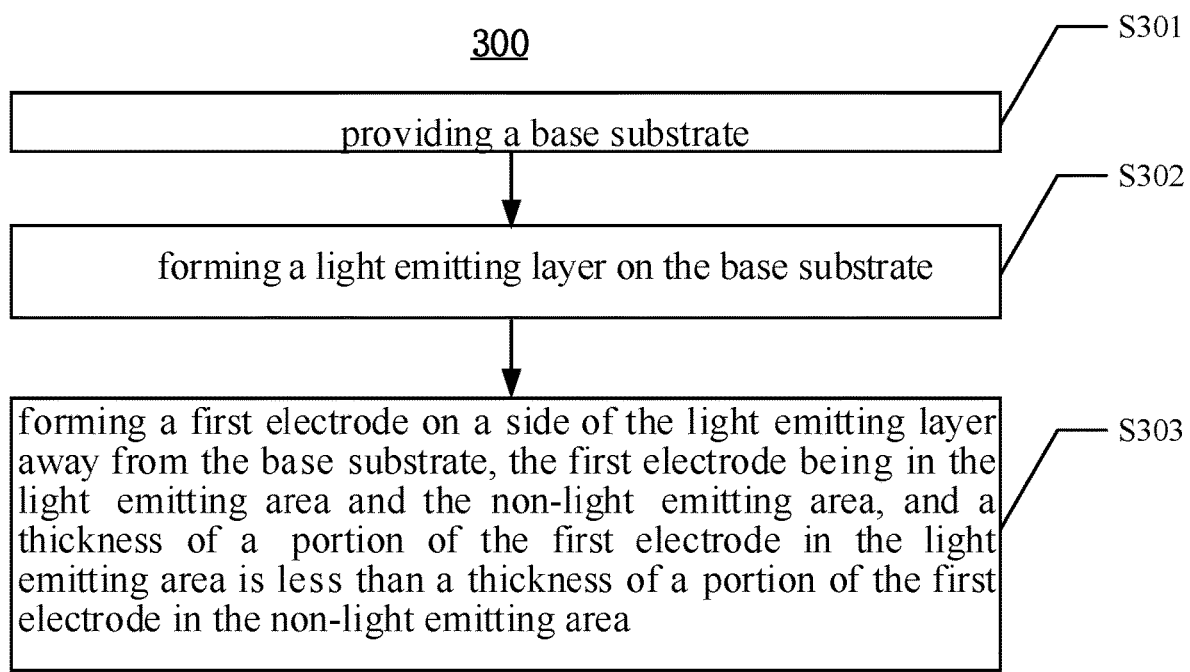
FIG. 4 illustrates a flowchart of a method for manufacturing an array substrate provided by an embodiment of the present disclosure.

Based on the same inventive concept, an embodiment of the present disclosure also provides a method for manufacturing an array substrate. FIG. 4 illustrates a flowchart of a method 300 for manufacturing an array substrate. The method is applicable to the array substrate 100 or array substrate 200 described in any of the previous embodiments. The method 300 comprises the following steps:

step S301, providing a base substrate 1;

step S302, forming a light emitting layer 3 on the base substrate 1; and step S303, forming a first electrode 4 on a side of the light emitting layer 3 away from the base substrate 1. The first electrode 4 is located in the light emitting area E1 and the non-light emitting area E2, and a thickness of a portion of the first electrode 4 located in the light emitting area E1 is less than a thickness of a portion of the first electrode 4 located in the non-light emitting area E2.

Optionally, before step S302, a second electrode 2 may also be formed on the base substrate 1 so that the second electrode 2 is located between the base substrate 1 and the light emitting layer 3.

Specifically, the second electrode 2 can be formed on the base substrate 1 by using processes such as photolithography, etching, evaporation, sputtering or the like. Then, the pixel defining layer 5 is prepared on the second electrode 2, and then in the light emitting area E1 defined by the pixel defining layer 5, the light emitting layer 3 is prepared on the second electrode 2 (the area where the light emitting layer 3 is prepared is the light emitting area E1). Next, the first electrode 4 is prepared. In an example, the light emitting layer 3 may be an organic light emitting layer, so that the formed array substrate is an organic light emitting diode array substrate. The first electrode 4 may be a cathode, and the second electrode 2 may be an anode.

The first electrode 4 can be prepared in a variety of manners, so that the thickness of the portion of the first electrode 4 located in the light emitting area E1 is less than the thickness of the portion of the first electrode 4 located in the non-light emitting area E2. Two implementations for preparing the first electrode 4 are described below.

One manner of preparing the first electrode 4 may be to form the first electrode 4 by multi-layer sub-electrodes, that is, the formed array substrate is the above mentioned array substrate 100.

With reference to FIG. 2 and FIG. 4, the second electrode 2 and the light emitting layer 3 may be sequentially formed on the base substrate 1, and then the first electrode 4 may be formed on the light emitting layer 3. Forming the first electrode 4 may comprise the following sub-steps: first forming a first sub-electrode layer 41 covering the light emitting area E1 and the non-light emitting area E2 on the light emitting layer 3, then, forming a second sub-electrode layer 42 located in the non-light emitting area E2 on the first sub-electrode layer 41, the first sub-electrode layer 41 is in direct contact with the second sub-electrode layer 42. In an alternative embodiment, first, a second sub-electrode layer 42 located in the non-light emitting area E2 can also be formed on the light emitting layer 3. Then, a first sub-electrode layer 41 covering the light emitting area E1 and the non-light emitting area E2 is formed on the second sub-electrode layer 42. The first sub-electrode layer 41 is prepared first and then the second sub-electrode layer 42 is prepared, which can avoid the problem of voids or gaps due to uneven distribution of electrode materials at the edges of the second-sub electrode layer 42 when the first sub-electrode layer 41 is prepared on the second sub-electrode layer 42 with spatially spaced distribution. Thereby, it is more beneficial to the preparation of the first electrode 4 with high reliability.

The thickness of the first sub-electrode layer 41 is T1, and the thickness of the second sub-electrode layer 42 is T2. The specific value of the thickness T1 of the first sub-electrode layer 41 can be set according to the transmittance and process conditions required by the array substrate 100, and the specific value of the thickness T2 of the second sub-electrode layer 42 can be set according to the resistance and process conditions required by the second electrode 4. In one example, the thickness T2 of the second sub-electrode layer 42 is greater than the thickness T1 of the first sub-electrode layer 41 to further ensure the transmittance of the first sub-electrode layer 41 to the light emitted by the light emitting layer 3, and to further reduce the overall resistance of the first electrode 4. In some embodiments, the thickness T1 of the first sub-electrode layer 41 is less than the thickness of the cathode layer in the conventional array substrate, and the thickness T2 of the second sub-electrode layer 42 is greater than the thickness of the cathode layer in the conventional array substrate. Through the stack design of the first sub-electrode layer 41 and the second sub-electrode layer 42, the thickness of the portion of the first electrode 4 located in the light emitting area E1 is T1, and the thickness of the portion of the first electrode 4 located in the non-light emitting area E2 is T1+T2. Therefore, the thickness of the portion of the first electrode 4 located in the light emitting area E1 is less than the thickness of the portion of the first electrode 4 located in the non-light emitting area E2.

Figure 5A:
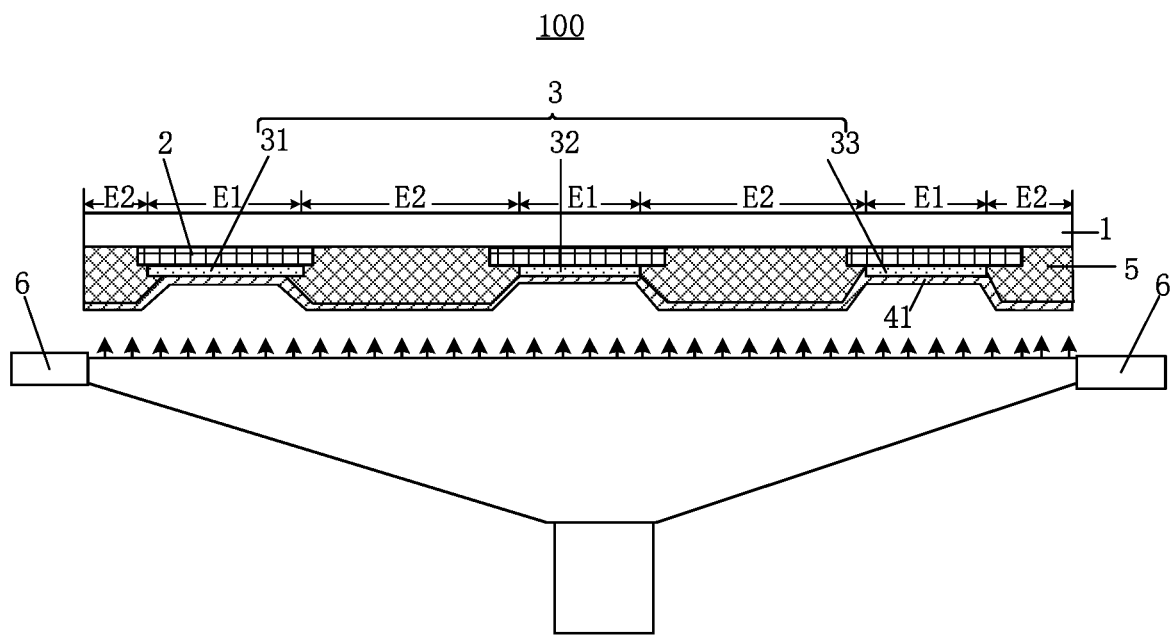
FIG. 5A illustrates a schematic diagram of a method for manufacturing a first sub-electrode layer provided by an embodiment of the present disclosure.
Figure 5B:
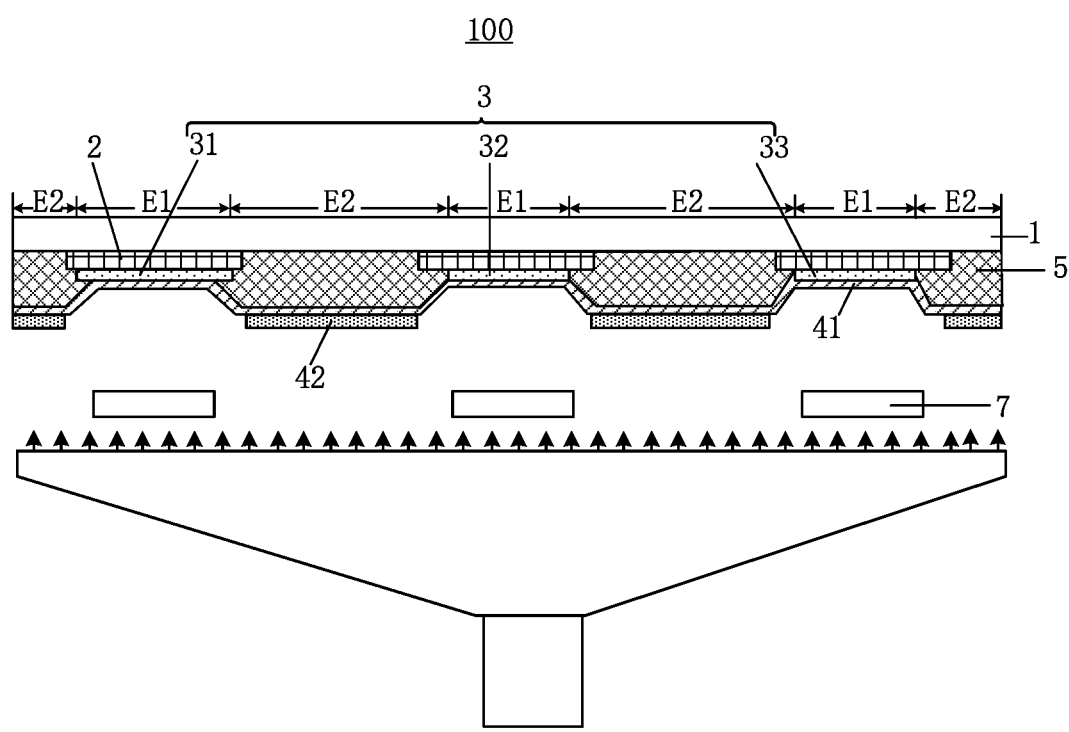
FIG. 5B illustrates a schematic diagram of a method for manufacturing a second sub-electrode layer provided by an embodiment of the present disclosure.

In an alternative embodiment, as illustrated in FIG. 5A, an open mask 6 may be used to form the first sub-electrode layer 41 by an evaporation process. Since the first sub-electrode layer 41 covers the light emitting area E1 and the non-light emitting area E2 of the array substrate 100, the use of the open mask can reduce the mask cost. Then, as illustrated in FIG. 5B, a fine metal mask 7 (FMM) may be used to form the second sub-electrode layer 42 on the side of the first sub-electrode layer 41 away from the base substrate 1 by an evaporation process. The specific shape of the mask body of the fine metal mask 7 corresponds to the shape and distribution of the light emitting area E1 on the array substrate 100, so as to achieve accurate coverage of the non-light emitting area E2 by the second sub-electrode layer 42. When the array substrate 100 is an OLED array substrate, the OLED luminescent material is easily damaged by water, oxygen and high temperature. However, in the embodiments of the present disclosure, although the first electrode 4 is fabricated after the preparation of the light emitting layer 3, the evaporation process used to form the first electrode 4 can avoid water and oxygen corrosion or high temperature damage to the light emitting layer 3. Thus, the reliability of the array substrate 100 can be improved.

Another manner of preparing the first electrode 4 may be to form the first electrode 4 through a single-layer conductive layer, that is, the formed array substrate is the above mentioned array substrate 200.

With reference to FIGS. 3 and 4, the second electrode 2, the pixel defining layer 5 and the light emitting layer 3 can be sequentially formed on the base substrate 1, and then the first electrode 4 can be formed on the light emitting layer 3. Forming the first electrode 4 may comprise the following sub-steps: first, forming a thicker first electrode layer covering the light emitting area E1 and the non-light emitting area E2 on the light emitting layer 3, then grinding or etching to thin the portion of the first electrode layer located in the light emitting area E1, so that the thickness of the portion of the formed first electrode 4 located in the light emitting area E1 is less than the thickness of the portion of the first electrode 4 located in the non-light emitting area E2. The thickness of the portion of the first electrode 4 located in the light emitting area E1 is T3, and the thickness of the portion of the first electrode 4 located in the non-light emitting area E2 is T4, with T3 smaller than T4.

Of course, it is not limited to using the above two methods to prepare the first electrode 4, and the embodiments of the present disclosure do not limit the specific forming method of the first electrode 4.

In the above method 300, by making the thickness of the portion of the formed first electrode 4 located in the light emitting area E1 to be less than the thickness of the portion of the first electrode 4 located in the non-light emitting area E2, it is possible to increase the transmittance of the portion of the first electrode 4 located in the light emitting area E1 while also reducing the overall resistance of the first electrode 4, thereby significantly reducing the power consumption of the array substrate.

Figure 6:
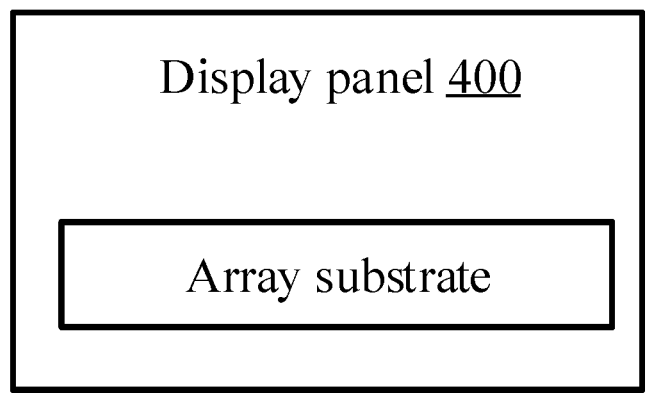
FIG. 6 illustrates a block diagram of a display panel provided by an embodiment of the present disclosure.

According to still another aspect of the present disclosure, a display panel is provided. FIG. 6 illustrates a block diagram of the display panel 400, which comprises the array substrate described in any of the previous embodiments. The display panel 400 may be various appropriate types of display panels, for example, it may be an OLED display panel.

Since the display panel 400 can have basically the same technical effects as the array substrate described in the previous embodiments, for the sake of brevity, the technical effects of the display panel 400 will not be repeated here.

Figure 7:
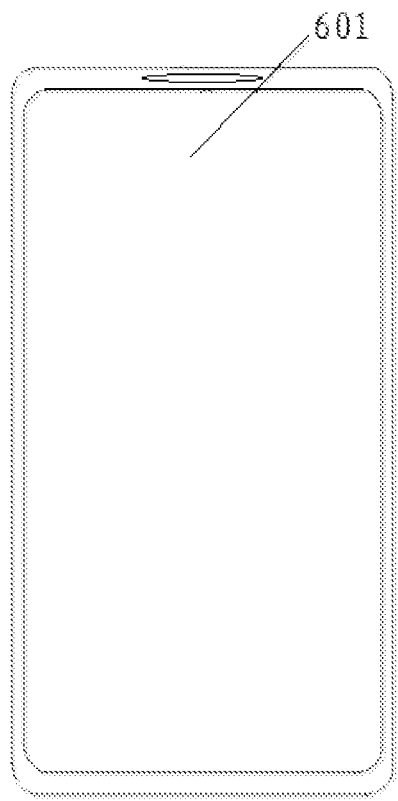
FIG. 7 illustrates a structural diagram of an electronic apparatus provided by an embodiment of the present disclosure.

According to yet another aspect of the present disclosure, there is provided an electronic apparatus. FIG. 7 illustrates a structural diagram of an electronic apparatus in an embodiment of the present disclosure. The electronic apparatus comprises a component 601. The component 601 may be the array substrate described in any of the previous embodiments. The electronic apparatus may be any appropriate electronic apparatus, comprising but not limited to any appropriate product or component such as a mobile phone, a tablet computer, a television, a monitor, a laptop, a digital photo frame, a navigator, an e book, and the like.

Since the electronic apparatus can have basically the same technical effects as the array substrate described in the previous embodiments, for the sake of brevity, the technical effects of the electronic apparatus will not be repeated here.

In short, the technical solutions provided in the embodiments of the present disclosure have at least the following technical effects or advantages:

In the array substrate and the manufacturing method thereof, the display panel and the electronic apparatus provided by the embodiments of the present disclosure, the first electrode 4 is designed such that the thickness of the portion located in the light emitting area E1 is less than the thickness of the portion located in the non-light emitting area E2. On the one hand, the transmittance is increased by making the portion of the first electrode 4 located in the light emitting area E1 have a thinner thickness, thereby increasing the brightness that transmits through the first electrode 4, and reducing the required pixel light emitting current, and achieving the effect of reducing power consumption. On the other hand, by making the portion of the first electrode 4 located in the non-light emitting area E2 have a thicker thickness, the overall resistance of the first electrode 4 is reduced, thereby reducing the voltage loss when the current flows through the first electrode 4, further achieving the effect of reducing power consumption.

In the description of the present disclosure, the orientation or positional relationship indicated by the terms "upper", "lower", "left", "right", etc. is based on the orientation or positional relationship shown in the drawings, and is only used to facilitate the description of the present disclosure. It is not required that the present disclosure must be constructed and operated in a particular orientation, and therefore cannot be understood as a limitation to the present disclosure.

In the description of this specification, the description with reference to the terms "one embodiment", "another embodiment", etc. means that the specific features, structures, materials, or characteristics described in conjunction with the embodiment are comprised in at least one embodiment of the present disclosure. In this specification, the schematic representations of the above terms do not necessarily refer to the same embodiment or example. Moreover, the described specific features, structures, materials or characteristics can be combined in any one or more embodiments or examples in a suitable manner. In addition, those skilled in the art can combine the different embodiments or examples and the features of the different embodiments or examples described in this specification without contradicting each other. In addition, it should be noted that in this specification, the terms "first" and "second" are only used for descriptive purposes, and cannot be understood as indicating or implying relative importance or implicitly indicating the number of indicated technical features.

As those skilled in the art will understand, although the various steps of the method in the present disclosure are described in a particular order in the accompanying drawings, this does not require or imply that these steps must be performed in the particular order, unless the context clearly indicates otherwise. Additionally or alternatively, multiple steps can be combined into one step for execution, and/or one step can be decomposed into multiple steps for execution. In addition, other method steps can be inserted between the steps. The inserted step may represent an improvement of the method such as described herein, or may be unrelated to the method. In addition, a given step may not be fully completed before the next step starts.

The above are only specific implementations of the present disclosure, but the protection scope of the present disclosure is not limited thereto. Any person skilled in the art can easily think of changes or substitutions within the technical scope disclosed in the present disclosure, and they should be encompassed by the protection scope of the present disclosure. Therefore, the protection scope of the present disclosure should be subject to the protection scope of the claims.

The invention claimed is:

1. An array substrate comprising:
   a base substrate;
   a plurality of light emitting layers arranged on the base substrate along a row direction and a column direction; and
   a first electrode on a side of the plurality of light emitting layers away from the base substrate,
   wherein the array substrate comprises a light emitting area and a non-light emitting area, the first electrode comprises a stacked first sub-electrode layer and a second sub-electrode layer, the first sub-electrode layer is in the light emitting area and the non-light emitting area, and the second sub-electrode layer is only in the non-light emitting area, and a thickness of a portion of the first electrode in the light emitting area is less than a thickness of a portion of the first electrode in the non-light emitting area,
   wherein an orthographic projection of the second sub-electrode layer on the base substrate does not overlap with an orthographic projection of each of the light emitting layers on the base substrate,
   wherein a width of a first portion of the first sub-electrode layer in the light-emitting area is greater than a width of a second portion of the first sub-electrode layer in the non-light emitting area, and
   wherein the second sub-electrode layer comprises a plurality of patterned layers, two adjacent light emitting layers of the plurality of light emitting layers are spaced by two patterned layers of the plurality of patterned layers which are disconnected from each other.

2. The array substrate of claim 1, wherein the second sub-electrode layer is on a side of the first sub-electrode layer away from the base substrate.

3. The array substrate of claim 1, wherein a thickness of the second sub-electrode layer is greater than a thickness of the first sub-electrode layer.

4. The array substrate of claim 1, wherein the first sub-electrode layer is in direct contact with the second sub-electrode layer.

5. The array substrate of claim 1, wherein the array substrate is an organic light emitting diode array substrate.

6. The array substrate of claim 1, further comprising a second electrode, wherein the second electrode is between the base substrate and the light emitting layer.

7. The array substrate of claim 6, wherein the first electrode is a cathode, and the second electrode is an anode.

8. A display panel comprising the array substrate of claim 1.

9. An electronic apparatus comprising the array substrate of claim 1.

10. A method for manufacturing an array substrate, wherein the array substrate comprises a light emitting area and a non-light emitting area, and the method comprises the following steps:
    providing a base substrate;
    forming a plurality of light emitting layers on the base substrate along a row direction and a column direction; and
    forming a first electrode on a side of the plurality of light emitting layers away from the base substrate, the first electrode comprising a stacked first sub-electrode layer and a second sub-electrode layer, the first sub-electrode layer being in the light emitting area and the non-light emitting area, and the second sub-electrode layer being only in the non-light emitting area, and a thickness of a portion of the first electrode in the light emitting area being less than a thickness of a portion of the first electrode in the non-light emitting area,
    wherein an orthographic projection of the second sub-electrode layer on the base substrate does not overlap with an orthographic projection of each of the light emitting layers on the base substrate,
    wherein a width of a first portion of the first sub-electrode layer in the light-emitting area is greater than a width of a second portion of the first sub-electrode layer in the non-light emitting area, and
    wherein the second sub-electrode layer comprises a plurality of patterned layers, two adjacent light emitting layers of the plurality of light emitting layers are spaced by two patterned layers of the plurality of patterned layers which are disconnected from each other.

11. The method of claim 10, wherein the step of forming a first electrode on a side of the plurality of light emitting layers away from the base substrate comprises:
    forming the first sub-electrode layer in the light emitting area and the non-light emitting area on the side of the light emitting layer away from the base substrate; and
    forming the second sub-electrode layer only in the non-light emitting area on a side of the first sub-electrode layer away from the base substrate.

12. The method of claim 11, wherein,
    forming the first sub-electrode layer on the side of the light emitting layer away from the base substrate through an evaporation process by using an open mask; and
    forming the second sub-electrode layer on the side of the first sub-electrode layer away from the base substrate through an evaporation process by using a fine metal mask.

13. The method of claim 11, wherein a thickness of the second sub-electrode layer is greater than a thickness of the first sub-electrode layer.

14. The method of claim 11, wherein the first sub-electrode layer is in direct contact with the second sub-electrode layer.

15. The method of claim 10, wherein the array substrate is formed as an organic light emitting diode array substrate.

16. The method of claim 10, before forming the plurality of light emitting layers on the base substrate, further comprising:

forming a second electrode on the base substrate, the second electrode being between the base substrate and the light emitting layer.

17. The method of claim 16,
wherein the step of forming a second electrode on the base substrate comprises:
forming an anode on the base substrate, and,
wherein the step of forming a first electrode on a side of the plurality of light emitting layers away from the base substrate comprises:
forming a cathode on the side of the plurality of light emitting layers away from the base substrate.

* * * * *